US012640686B2

(12) United States Patent
Wang et al.

(10) Patent No.: US 12,640,686 B2
(45) Date of Patent: May 26, 2026

(54) HARMONIC MIXER WITH MULTI-PHASE LOCAL OSCILLATOR SIGNALS FOR INHERENTLY LINEAR UPCONVERSION

(71) Applicant: THE REGENTS OF THE UNIVERSITY OF CALIFORNIA, Oakland, CA (US)

(72) Inventors: Huan Wang, Irvine, CA (US); Payam Heydari, Irvine, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 18/918,437

(22) Filed: Oct. 17, 2024

(65) Prior Publication Data

US 2025/0105787 A1    Mar. 27, 2025

Related U.S. Application Data

(63) Continuation of application No. PCT/US2023/019356, filed on Apr. 21, 2023.

(60) Provisional application No. 63/333,715, filed on Apr. 22, 2022.

(51) Int. Cl.
*H03D 7/12* (2006.01)
(52) U.S. Cl.
CPC .................................. *H03D 7/125* (2013.01)

(58) Field of Classification Search
CPC ....................................................... H03D 7/125
USPC ........................................................ 327/355
See application file for complete search history.

(56) References Cited

U.S. PATENT DOCUMENTS

| | | | |
|---|---|---|---|
| 2005/0239430 A1* | 10/2005 | Shah .................... | H03D 7/1433 455/302 |
| 2006/0135108 A1 | 6/2006 | De Ranter et al. | |
| 2013/0183921 A1* | 7/2013 | Mu .......................... | H04B 1/06 455/326 |
| 2015/0188741 A1* | 7/2015 | Chen ........................ | G06G 7/16 327/356 |
| 2021/0367629 A1 | 11/2021 | Ravi et al. | |

OTHER PUBLICATIONS

WO, PCT/US23/19356 ISR and Written Opinion, Jul. 19, 2023.

* cited by examiner

*Primary Examiner* — Tomi Skibinski
(74) *Attorney, Agent, or Firm* — ONE LLP

(57) ABSTRACT

Disclosed are example embodiments of harmonic mixer. The harmonic mixer including a multi-phase LO signal generator. Each phase of the multi-phase LO signal generator outputting an LO signal on a signal line. The harmonic mixer including a plurality of mixers. Each mixer of the plurality of mixers connected to a signal line. The mixer driven by an IF. The harmonic mixer including an output network coupled to the outputs of the plurality of mixers.

12 Claims, 7 Drawing Sheets

Outputt an LO signal on a signal line in each phase of a multi-phase LO signal generator

702

Drive each mixer of a plurality of mixers by an intermediate frequency (IF), each mixer of the plurality of mixers connected to a signal line

704

Couple an output network to the outputs of the plurality of mixers.

706

HARMONIC MIXER WITH MULTI-PHASE LOCAL OSCILLATOR SIGNALS FOR INHERENTLY LINEAR UPCONVERSION

CROSS-REFERENCE TO RELATED APPLICATIONS

This application is a continuation of International Patent Application Serial No. PCT/US23/19356, filed Apr. 21, 2023, which claims the benefit of priority under 35 U.S.C. § 119(e) from U.S. Provisional Application Ser. No. 63/333, 715, filed Apr. 22, 2022, both of which are hereby incorporated by reference in their entireties for all purposes.

TECHNICAL FIELD

The disclosure relates generally to the field of transmitters for wireless communication, and specifically and not by way of limitation, some embodiments are related to a harmonic mixer that upconverts signal to an integer multiple of the local oscillator (LO) frequency.

BACKGROUND

Up-conversion frequency mixers are at the core of many wireless transmitter architectures. A direct conversion architecture may be widely adopted in wireless systems for communication, radar ranging and imaging. However, as the operation frequency of these systems move higher into the mm-wave or terahertz (THz) regime targeting emerging applications, the high frequency local oscillator (LO) signal generation becomes an increasingly challenging task for direct up-conversion mixers. The situation is further exacerbated in transmitter array configurations used in various scenarios that need beam-steering or spatial multiplexing. More precisely, mm-wave communication systems supporting multi-user multiple-input and multiple-output (MU-MIMO) and beamforming would employ a large number of full transmitter chains. Each transmitter chain includes baseband, mixer, and mm-wave amplifier. The high frequency LO signal must be distributed to each transmitter with a huge LO distribution network, which incurs significant amount of signal loss and phase skew.

The use of harmonic mixer would alleviate the aforementioned problems in mm-wave and THz transmitters, as the harmonic mixer takes lower LO frequency and generates output at an integer multiple of the LO frequency. Nevertheless, conventional approaches take advantage of the semiconductor device (e.g., Schottky diode) non-linearity to perform harmonic frequency up-conversion. The diode-based harmonic generation approach shows poor linearity because of the rectifying electrical property of a diode and is, therefore, unsuitable for high-fidelity communication schemes where high order quadrature-amplitude-modulation (QAM) signal transmission mandates excellent linearity in the signal path. Moreover, high frequency Schottky diodes are typically manufactured in III-V compound semiconductor technology such as GaAs (e.g., compounds that are members of the so-called III-V group of semiconductors—that is, compounds made of elements listed in columns III and V of the periodic table) and may be difficult to integrate into standard Complementary Metal Oxide-Semiconductor (CMOS) technologies for highly integrated systems.

Accordingly, a need exists for an improved harmonic up-conversion mixer that reduces the burden of LO generation and distribution while maintaining superb linearity to enable millimeter-wave (mm-wave)/THz systems in large array configuration.

SUMMARY

In one example implementation, an embodiment includes a harmonic up-conversion mixer with inherently linear operation. The harmonic up-conversion mixer including a multi-phase LO signal generator that produces (2N+1) LO signals at the same frequency with equally spaced phase, where N is a non-negative integer greater than zero. The (2N+1) LO signals each drive a current steering double-balanced mixer, where the mixer outputs are shorted together and connected to a generic output network for signal resonance at the desired center frequency. The single-sideband (SSB) up-conversion may be performed with in-phase and quadrature (I/Q) LO signals plus the I/Q intermediate frequency (IF) signals. Therefore, the number of mixers required in SSB configuration doubles. The method of generating multi-phase LO generation may be arbitrary using delay-locked-loop (DLL), poly-phase filter, phase shifters, or other such devices.

Disclosed are example embodiments of harmonic mixer. The harmonic mixer including a multi-phase LO signal generator. Each phase of the multi-phase LO signal generator outputting an LO signal on a signal line. The harmonic mixer including a plurality of mixers. Each mixer of the plurality of mixers connected to an RF signal line. The mixer is also driven by an IF signal. The harmonic mixer including an output network coupled to the outputs of the plurality of mixers.

Disclosed are example embodiments of a method in a harmonic mixer, the method comprising outputting an LO signal on a signal line in each phase of a multi-phase LO signal generator. The method further includes driving each mixer of a plurality of mixers by an intermediate frequency (IF), each mixer of the plurality of mixers connected to a signal line and coupling an output network to the outputs of the plurality of mixers.

The features and advantages described in the specification are not all-inclusive. In particular, many additional features and advantages will be apparent to one of ordinary skill in the art in view of the drawings, specification, and claims. Moreover, it should be noted that the language used in the specification has been principally selected for readability and instructional purposes and may not have been selected to delineate or circumscribe the disclosed subject matter.

BRIEF DESCRIPTION OF THE DRAWINGS

The foregoing summary, as well as the following detailed description, is better understood when read in conjunction with the accompanying drawings. The accompanying drawings, which are incorporated herein and form part of the specification, illustrate a plurality of embodiments and, together with the description, further serve to explain the principles involved and to enable a person skilled in the relevant art(s) to make and use the disclosed technologies.

US 12,640,686 B2

3

Figure 4:
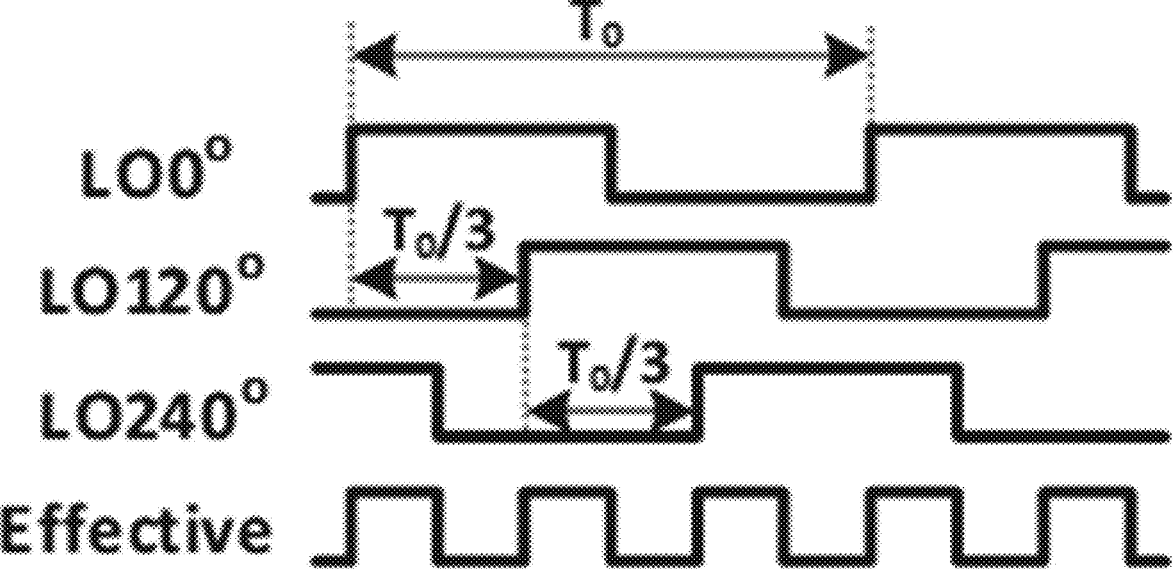

FIG. 4 is a diagram illustrating an LO waveform for a third harmonic mixer example.

Figure 5:
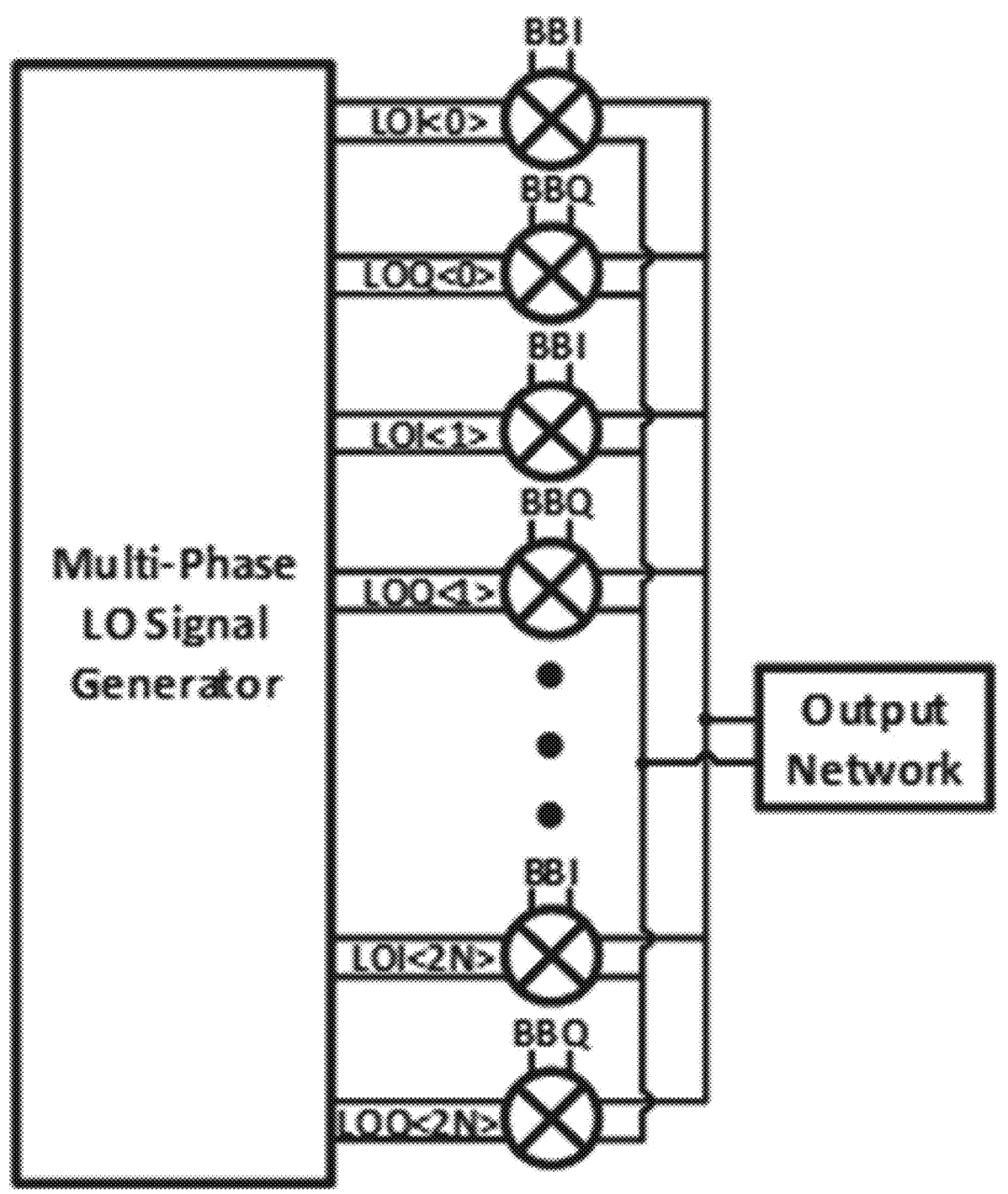

FIG. 5 is a diagram illustrating a harmonic mixer in single-sideband up-conversion configuration in accordance with the systems and methods described herein.

Figure 6:
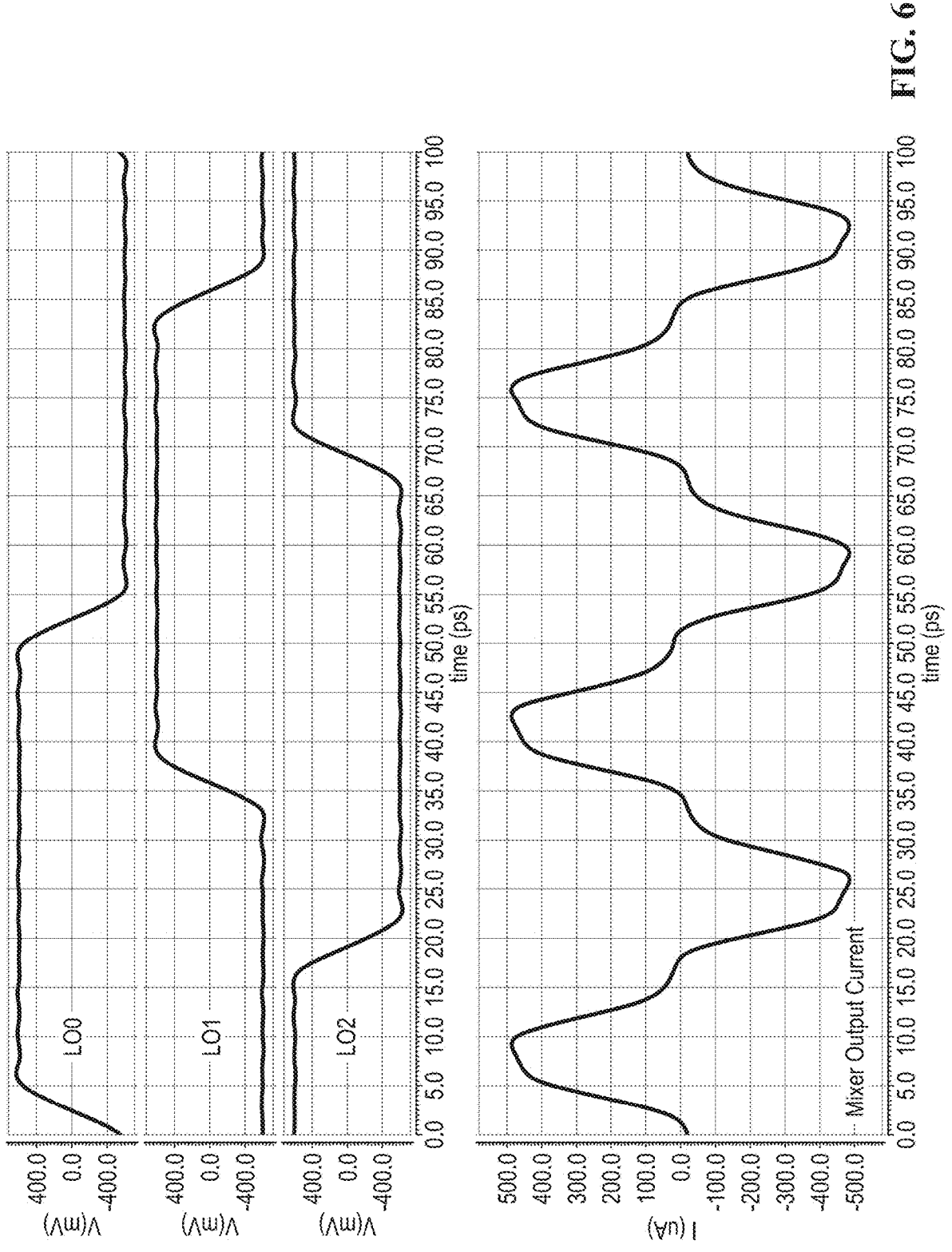

FIG. 6 is a diagram illustrating transient waveform in a third harmonic mixer showing LO and output relationship.

Figure 7:
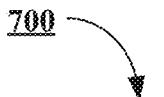
Figure 7:
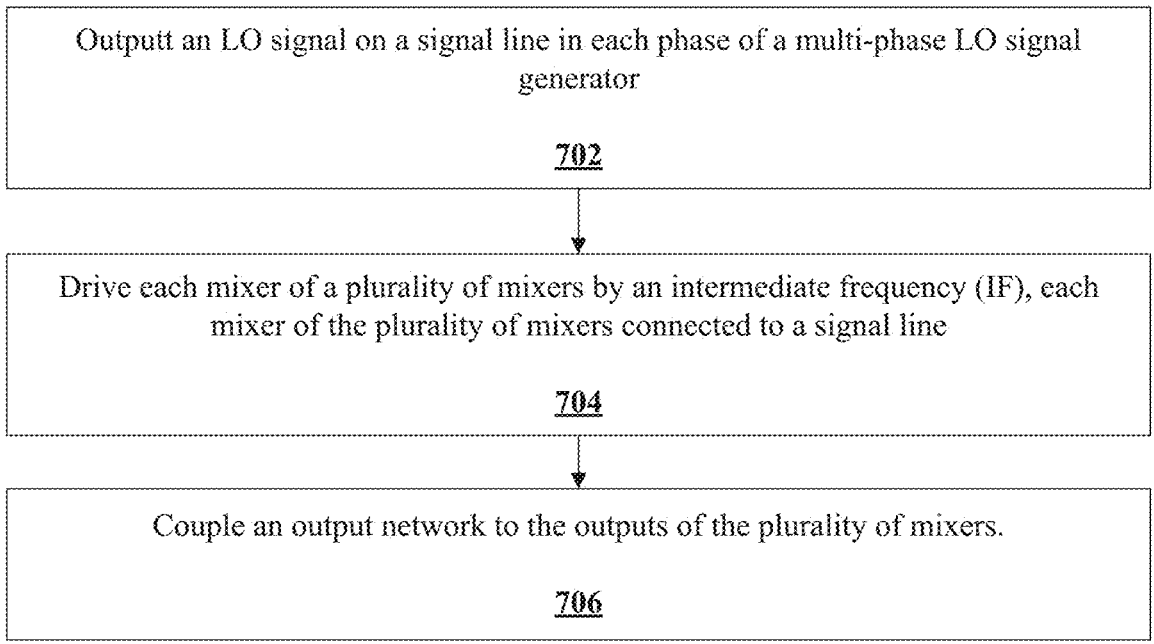

FIG. 7 is a flow diagram illustrating an example method in accordance with the systems and methods described herein.

The figures and the following description describe certain embodiments by way of illustration only. One skilled in the art will readily recognize from the following description that alternative embodiments of the structures and methods illustrated herein may be employed without departing from the principles described herein. Reference will now be made in detail to several embodiments, examples of which are illustrated in the accompanying figures. It is noted that wherever practicable similar or like reference numbers may be used in the figures to indicate similar or like functionality.

DETAILED DESCRIPTION

The detailed description set forth below in connection with the appended drawings is intended as a description of configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of example systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using various components, hardware, electronic hardware, computer software, or any combination thereof. Whether such elements are implemented as hardware or software depends upon the particular application and design constraints imposed on the overall system.

An example embodiment may include a harmonic up-conversion mixer with inherently linear operation. The example embodiment may include a multi-phase LO signal generator that produces (2N+1) LO signals at the same frequency with equally spaced phase. In an example embodiment, N is a non-negative integer greater than zero. The (2N+1) LO signals may each drive a current steering double-balanced mixer, where the mixer outputs may be shorted together and connected to a generic output network for signal resonance at the desired center frequency. The single-sideband (SSB) up-conversion may be performed with in-phase and quadrature (I/Q) LO signals plus the I/Q IF signals. Therefore, the number of mixers required in SSB configuration doubles. The method of generating multi-phase LO generation may be arbitrary using one or more of a delay-locked-loop (DLL), poly-phase filter, or phase shifters.

Figure 1:
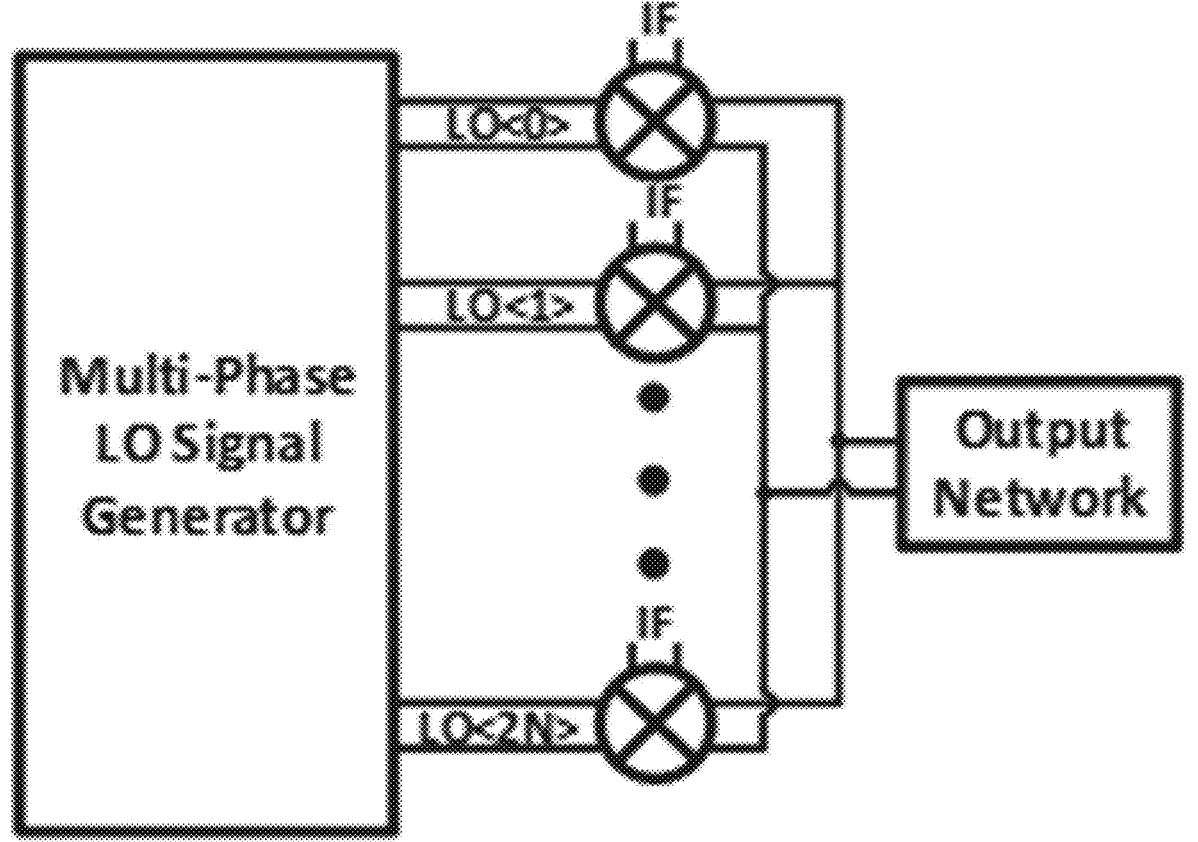
FIG. 1 is a diagram illustrating a harmonic mixer topology in accordance with the systems and methods described herein.

FIG. 1 is a diagram illustrating a harmonic mixer topology 100 in accordance with the systems and methods described herein. The example harmonic mixer topology 100 is illustrated in FIG. 1 in the harmonic mixer's generic form.

In the illustrated example of FIG. 1, the harmonic mixer topology 100 includes a multi-phase LO signal generator 102. The multi-phase LO signal generator 102 outputs a number of LO signals 104, e.g., LO<0> to LO<2N>, where N may be a non-negative integer greater than zero, as discussed above. Each of the LO signals 104 may be connected to a mixer 106 driven by an intermediate frequency (IF) signal 108. In an example embodiment, the LO signal generator 102 may be an electronic oscillator that may be used with the mixer 106 to change the frequency of a signal. This frequency conversion process may be referred to as heterodyning. The frequency conversion process may produce the sum and difference frequencies from the frequency of the LO signal generator 102 and the frequency of the input signal, e.g., the IF signal 108. A phase-locked loop (PLL) is one common type of LO signal generator 102 that provides good stability and performance at relatively low cost, but the LO signal generator's 102 frequency is fixed, so changing frequencies requires changing the PLL. Tuning to different frequencies may require a variable-frequency oscillator which may lead to a compromise between stability and tunability. The output of the mixer 106 may drive an output network 110. Each mixer cell illustrated in FIG. 1 may be realized with current steering topology, e.g., as illustrated in FIGS. 2A-2B.

Figure 2A:
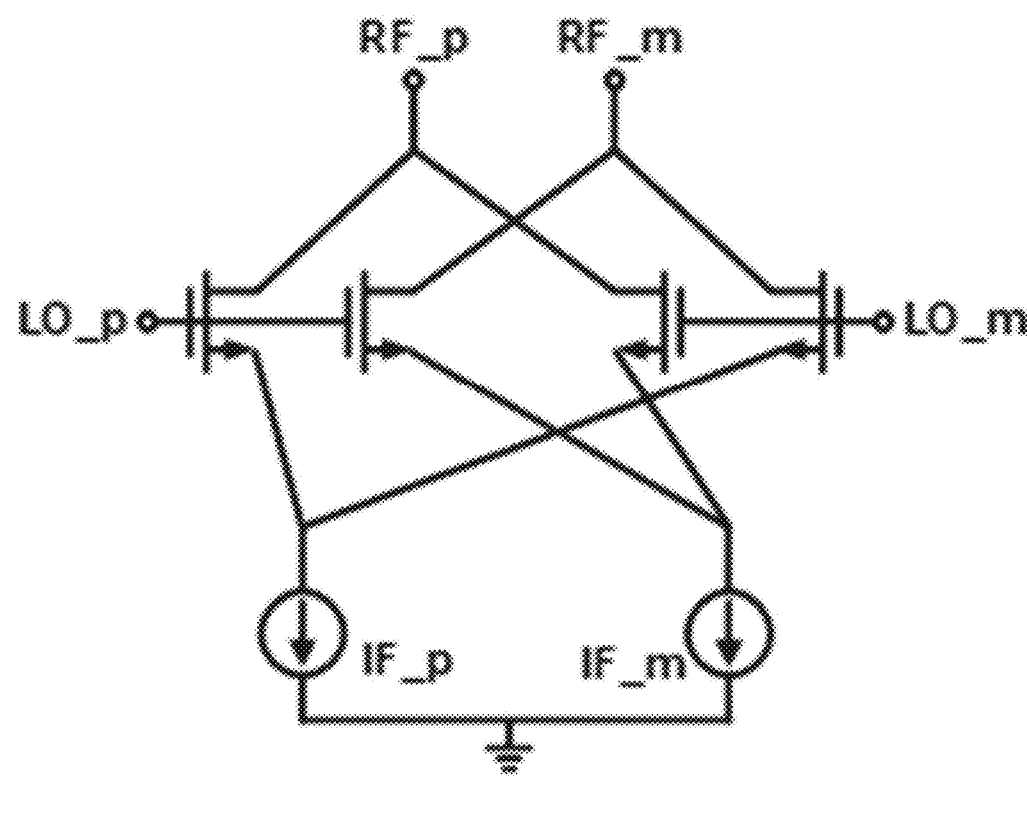
FIGS. 2A-2B are diagrams illustrating current steering mixer cells.
Figure 2B:
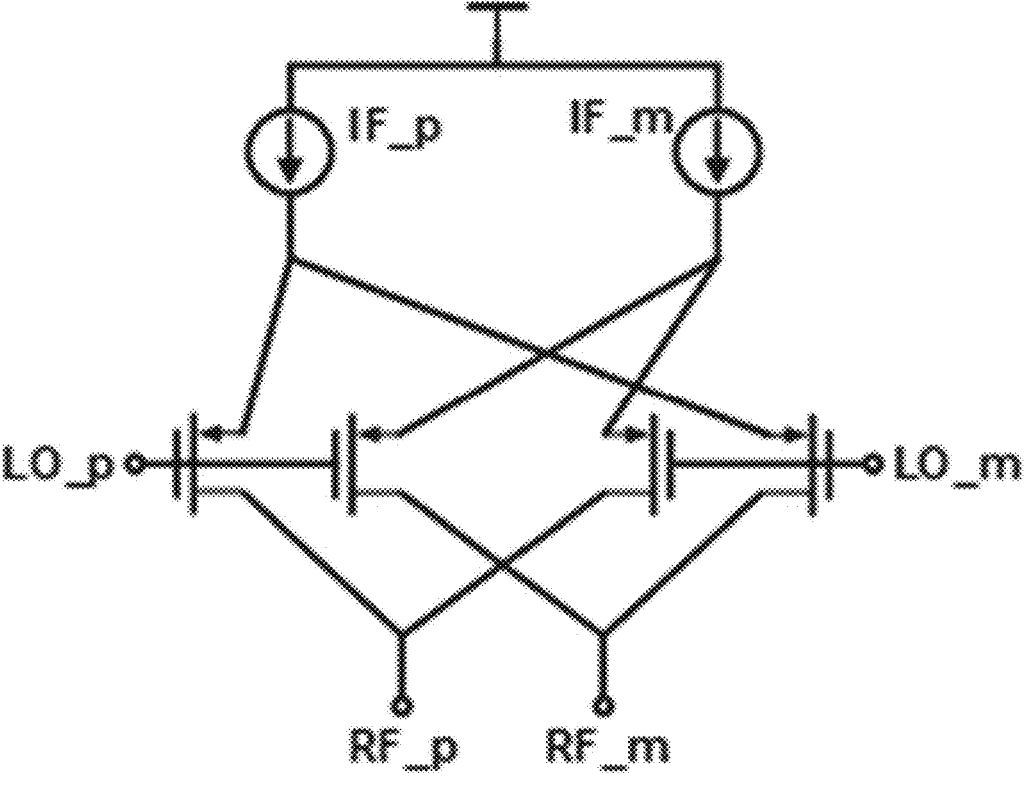

FIGS. 2A-2B are diagrams illustrating current steering mixer cells 200, 250. The current steering topology may take the form of an N-type metal-oxide-semiconductor (NMOS) transistors (FIG. 2A) or P-type metal-oxide-semiconductor (PMOS) transistor implementation (FIG. 2B), as illustrated in FIGS. 2A-2B. As illustrated in FIG. 2A, a series of NMOS transistors 202 may be connected to current drivers 204, as illustrated in FIG. 2A. As illustrated in FIG. 2B, a series of PMOS transistors 252 may be connected to current drivers 254, as illustrated in FIG. 2B.

Another example embodiment may employ a complementary NMOS+PMOS realization. The IF signals may first be converted into current domain. The conversion to the current domain may be indicated by the current sources IF_p and IF_m in FIGS. 2A-2B. The converted IF signals may then be commutated between the radio frequency (RF) differential signals, RF_p and RF_m, branch for frequency up-conversion. The signal transfer from IF to RF may be linear because the IF signal may be multiplied by an effective square wave toggling between +1 and −1, with no IF signal dependence. Up-conversion gain may be well defined mathematically by the Fourier Series component of the effective square wave. It is noteworthy that in conventional diode-based harmonic mixers, the conversion gain may be a function of port signal amplitude and, thus, incurs severe IF signal non-linearity.

In an example embodiment, the mixer output may only contain odd harmonics due to differential operation. The inclusion of only odd harmonics may minimize unwanted interference and noise coupling. The conversion gain of the $(2N+1)^{th}$ harmonic of a single mixer cell is:

$$4/(\pi(2N+1)) \qquad \text{[EQ. 1]}$$

To reinforce the $(2N+1)^{th}$ harmonic at the final mixer output, each mixer cell may be driven by LO signals with equal phase difference. The equally spaced phases of the multiple LO signals are:

$$2\pi k / (2N + 1) \qquad \text{[EQ. 2]}$$

where $$k = 0, 1, 2 \dots 2N$$

Given this LO phase relationship, the $(2N+1)^{th}$ harmonic up-conversion from different mixer cells are all in-phase and are added constructively at the mixer output. The overall conversion gain from IF to $(2N+1)^{th}$ harmonic remains to be $4/\pi$, same as a fundamental mixer and much higher than diode-based counterparts.

Figure 3:
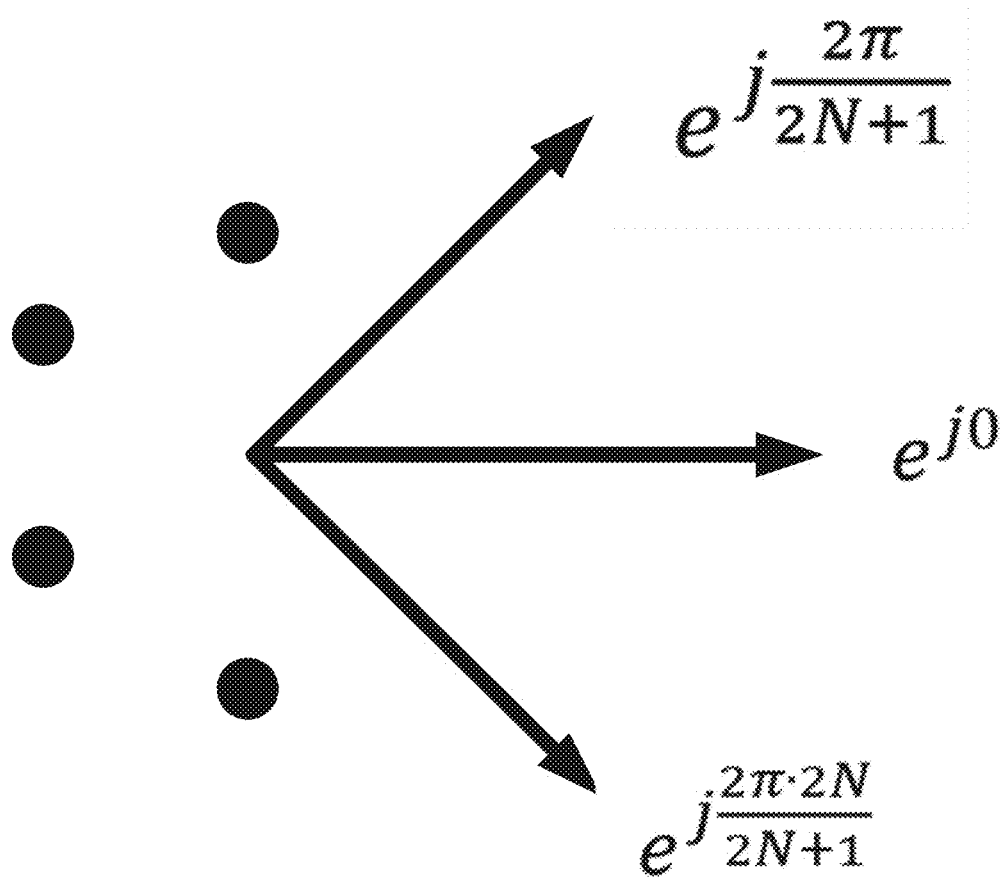
FIG. 3 is a diagram illustrating phasor domain illustration of fundamental up-conversion Cancellation.

FIG. 3 is a diagram illustrating phasor domain illustration of fundamental up-conversion cancellation 300. In an example embodiment, the fundamental up-conversion at the LO frequency will be canceled out at the same time. The fundamental up-conversion at the LO frequency being canceled out at the same time is illustrated in FIG. 3 by the phasor diagram. The 2N+1 equal amplitude phasor with identical phase difference will add up to zero. The nulling of fundamental frequency component ensures a cleaner mixer output and alleviates the filtering requirement in succeeding stages of the transmitter chain. This is also advantageous compared to traditional harmonic mixers where all harmonics are present and the wanted harmonic up-conversion must be selected carefully in the output network. The unwanted harmonic in the invented mixer topology appears at:

$$(2N + 1) * (2M + 1), \qquad \text{[EQ. 3]}$$

where $$M = 1, 2, \dots$$

On the other hand, the unwanted harmonics in conventional harmonic mixer will appear at (2N+1) of the LO frequency. For example, in a 3rd harmonic mixer, conventional approach will generate unwanted harmonics at $1^{th}$, $5^{th}$, $7^{th}$, $9^{th}$, $11^{th}$ . . . while the invented mixer only produces unwanted harmonics at $9^{th}$, $15^{th}$, $21^{th}$ . . . .

FIG. 4 is a diagram illustrating an LO waveform for a third harmonic mixer example 400. The exemplary LO waveform for a third harmonic up-conversion mixer is illustrated in FIG. 4. In an example embodiment, three LO signals 402 (LO0°, LO120°, LO240° with phase difference of 120 degrees may be used to drive three mixer cells. By adding the 3-phase LO signals 402 together, an effective mixing waveform 404 ("Effective") may be produced whose frequency may be three times the original LO frequency. Adding the 3-phase LO signals together may guarantee IF signal up-conversion by the third harmonic of the LO frequency, while the fundamental LO up-conversion may be zero.

FIG. 5 is a diagram illustrating a harmonic mixer 500 in single-sideband up-conversion configuration in accordance with the systems and methods described herein. The mixer 100 topology in FIG. 1 may perform double-sideband (DSB) up-conversion. The mixer 500 topology in FIG. 1 may also generate an image signal around the desired LO harmonic. Generating an image signal around the desired LO harmonic may be acceptable in certain applications where some form of image rejection takes place after the mixer. In scenarios where single-sideband (SSB) up-conversion may be required, such as in a quadrature mixer for QAM modulation, the invented harmonic mixer 500 may be extended to FIG. 5 to support quadrature operation. The number of required LO phases and mixer cells doubles compared to the DSB configuration in FIG. 1. Two adjacent mixer cells may form a quadrature mixer pair, driven by baseband I/Q and LO I/Q signals. The baseband I/Q signals may be identical among the 2N+1 quadrature mixer pairs. The operation of invented mixer topology may be verified in simulation platform in a third harmonic SSB configuration to prove the feasibility.

In the illustrated example of FIG. 5, the harmonic mixer 500 topology includes a multi-phase LO signal generator 502. The multi-phase LO signal generator 502 outputs a number of LO signals 504, e.g., LO<0> to LO<2N>, where N may be a non-negative integer greater than zero, as discussed above. Each of the LO signals 504 may be connected to a mixer 506 driven by baseband in-phase (BBI)/baseband quadrature (BBQ) 508. The output of the mixer 506 may drive an output network 510.

FIG. 6 is a diagram 600 illustrating a transient waveform 602 in a third harmonic mixer illustrating an LO 604 and output relationship, e.g., of waveform 602. The corresponding waveform 602 is illustrated in FIG. 6 for an exemplary LO 604 frequency of 10 gigahertz (GHz). The invented topology may be applied to any frequency.

In an example embodiment, the period of LO 604 and mixer output (waveform 602) may be 3:1, indicating the mixer output is at the third harmonic of the LO signals (LO0, LO1, LO2) and no fundamental LO component is presented. The higher order harmonics (e.g., $9^{th}$, $15^{th}$, $21^{th}$ . . . order harmonics) may be filtered out in the output network.

In an example embodiment, a harmonic mixer does not rely on device non-linearity to perform harmonic mixing. Instead, the harmonic mixer may be based on combining the output of inherently linear mixer cells, driven by multiple LO phases. The harmonic mixer may offer a superior linearity performance than conventional diode-based harmonic mixer topologies. Furthermore, the harmonic mixer may be free of the fundamental up-conversion and the undesired harmonics appear at a much higher frequencies, significantly alleviating the spur filtering problem in conventional harmonic mixers.

FIG. 7 is a flow diagram illustrating an example method in accordance with the systems and methods described herein. The example method may be a method in a harmonic mixer. The method may include outputting an LO signal on a signal line in each phase of a multi-phase LO signal generator (702). The method may also include driving each mixer of a plurality of mixers by an intermediate frequency (IF), each mixer of the plurality of mixers connected to a signal line (704). Additionally, the method may include coupling an output network to the outputs of the plurality of mixers (706).

In an example embodiment, the method may further include providing inherently linear operation with the harmonic up-conversion mixer. In an example embodiment, the method may further include producing (2N+1) LO signals at the same frequency with equally spaced phase, where N is a non-negative integer greater than zero. In an example embodiment, the method may further include driving a current steering double-balanced mixer using the (2N+1) LO signals.

In an example embodiment, the method may further include shorting together the mixer outputs and connecting the mixer outputs to the output network, the output network comprising a generic output network for signal resonance at the desired center frequency. In an example embodiment, the method may further include producing multi-phase LO generation using at least one of a delay-locked-loop (DLL), poly-phase filter, or phase shifters.

In an example embodiment, the harmonic mixer comprises a harmonic up-conversion mixer. In an example embodiment, the harmonic up-conversion used comprises a single-sideband (SSB) up-conversion performed with in-phase and quadrature (I/Q) LO signals plus the I/Q baseband signals.

One or more elements or aspects or steps, or any portion(s) thereof, from one or more of any of the systems and methods described herein may be combined with one or more elements or aspects or steps, or any portion(s) thereof, from one or more of any of the other systems and methods described herein and combinations thereof, to form one or more additional implementations and/or claims of the present disclosure.

One or more of the components, steps, features, and/or functions illustrated in the figures may be rearranged and/or combined into a single component, block, feature or function or embodied in several components, steps, or functions. Additional elements, components, steps, and/or functions may also be added without departing from the disclosure. The apparatus, devices, and/or components illustrated in the Figures may be configured to perform one or more of the methods, features, or steps described in the Figures. The algorithms described herein may also be efficiently implemented in software and/or embedded in hardware.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description are presented in terms of algorithms and symbolic representations of operations on data bits within a computer memory. These algorithmic descriptions and representations are the methods used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared or otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the following disclosure, it is appreciated that throughout the disclosure terms such as "processing," "computing," "calculating," "determining," "displaying" or the like, refer to the action and processes of a computer system, or similar electronic computing device, that manipulates and transforms data represented as physical (electronic) quantities within the computer system's registers and memories into other data similarly represented as physical quantities within the computer system's memories or registers or other such information storage, transmission or display.

The figures and the following description describe certain embodiments by way of illustration only. One skilled in the art will readily recognize from the following description that alternative embodiments of the structures and methods illustrated herein may be employed without departing from the principles described herein. Reference will now be made in detail to several embodiments, examples of which are illustrated in the accompanying figures. It is noted that wherever practicable similar or like reference numbers may be used in the figures to indicate similar or like functionality.

The foregoing description of the embodiments of the present invention has been presented for the purposes of illustration and description. It is not intended to be exhaustive or to limit the present invention to the precise form disclosed. Many modifications and variations are possible in light of the above teaching. It is intended that the scope of the present invention be limited not by this detailed description, but rather by the claims of this application. As will be understood by those familiar with the art, the present invention may be embodied in other specific forms without departing from the spirit or essential characteristics thereof. Likewise, the particular naming and division of the modules, routines, features, attributes, methodologies and other aspects are not mandatory or significant, and the mechanisms that implement the present invention or its features may have different names, divisions and/or formats.

Furthermore, as will be apparent to one of ordinary skill in the relevant art, the modules, routines, features, attributes, methodologies and other aspects of the present invention can be implemented as software, hardware, firmware or any combination of the three. Also, wherever a component, an example of which is a module, of the present invention is implemented as software, the component can be implemented as a standalone program, as part of a larger program, as a plurality of separate programs, as a statically or dynamically linked library, as a kernel loadable module, as a device driver, and/or in every and any other way known now or in the future to those of ordinary skill in the art of computer programming.

Additionally, the present invention is in no way limited to implementation in any specific programming language, or for any specific operating system or environment. Accordingly, the disclosure of the present invention is intended to be illustrative, but not limiting, of the scope of the present invention, which is set forth in the following claims.

It is understood that the specific order or hierarchy of blocks in the processes/flowcharts disclosed is an illustration of example approaches. Based upon design preferences, it is understood that the specific order or hierarchy of blocks in the processes/flowcharts may be rearranged. Further, some blocks may be combined or omitted. The accompanying method claims present elements of the various blocks in a sample order and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

The invention claimed is:

1. A harmonic mixer, comprising:
   a multi-phase LO signal generator, each phase of the multi-phase LO signal generator outputting an LO signal on a signal line;
   a plurality of mixers, each mixer of the plurality of mixers connected to a signal line, the mixer driven by an intermediate frequency (IF); and an output network coupled to the outputs of the plurality of mixers,
   wherein the harmonic mixer is configured to perform single-sideband (SSB) up-conversion using in-phase and quadrature (I/Q) local oscillator (LO) signals and corresponding I/Q baseband signals.

2. The harmonic mixer of claim 1, wherein the harmonic up-conversion mixer provides inherently linear operation.

3. The harmonic mixer of claim 1, wherein the multi-phase LO signal generator produces (2N+1) LO signals at the same frequency with equally spaced phase, where N is a non-negative integer greater than zero.

4. The harmonic mixer of claim 3, wherein the (2N+1) LO signals each drive a current steering double-balanced mixer.

5. The harmonic mixer of claim 4, wherein the mixer outputs are shorted together and connected to the output network, the output network comprising a generic output network for signal resonance at the desired center frequency.

6. The harmonic mixer of claim 1, wherein the multi-phase LO signal generator produces multi-phase LO signals using at least one of a delay-locked-loop (DLL), poly-phase filter, or phase shifter.

7. A method in a harmonic mixer, the method comprising:
   outputting an LO signal on a signal line in each phase of a multi-phase LO signal generator; driving each mixer of a plurality of mixers by an intermediate frequency (IF), each mixer of the plurality of mixers connected to a signal line; and
   coupling an output network to the outputs of the plurality of mixers,
   wherein the method further comprises performing single-sideband (SSB) up-conversion using in-phase and quadrature (I/Q) local oscillator (LO) signals and corresponding I/Q baseband signals.

8. The method of claim 7, further comprising providing inherently linear operation with the harmonic up-conversion mixer.

9. The method of claim 7, further comprising producing (2N+1) LO signals at the same frequency with equally spaced phase, where N is a non-negative integer greater than zero.

10. The method of claim 9, further comprising driving a current steering double-balanced mixer using the (2N+1) LO signals.

11. The method of claim 10, further comprising shorting together the mixer outputs and connected the mixer outputs to the output network, the output network comprising a generic output network for signal resonance at the desired center frequency.

12. The method of claim 7, further comprising producing multi-phase LO generation using at least one of a delay-locked-loop (DLL), poly-phase filter, or phase shifters.

* * * * *